United States Patent
Sendhoff

(10) Patent No.: US 10,460,073 B2
(45) Date of Patent: Oct. 29, 2019

(54) METHOD FOR IMPROVING ERGONOMICS OF A VEHICLE COCKPIT

(71) Applicant: HONDA RESEARCH INSTITUTE EUROPE GMBH, Offenbach/Main (DE)

(72) Inventor: Bernhard Sendhoff, Offenbach (DE)

(73) Assignee: HONDA RESEARCH INSTITUTE EUROPE GMBH, Offenbach/Main (DE)

( * ) Notice: Subject to any disclaimer, the term of this patent is extended or adjusted under 35 U.S.C. 154(b) by 372 days.

(21) Appl. No.: 15/019,184

(22) Filed: Feb. 9, 2016

(65) Prior Publication Data

US 2016/0292352 A1    Oct. 6, 2016

(30) Foreign Application Priority Data

Apr. 2, 2015 (EP) .................................. 15162468
Apr. 27, 2015 (EP) .................................. 15165221

(51) Int. Cl.
*G06F 17/50* (2006.01)
*B60K 37/04* (2006.01)
(Continued)

(52) U.S. Cl.
CPC .......... *G06F 17/5095* (2013.01); *B60K 35/00* (2013.01); *B60K 37/00* (2013.01);
(Continued)

(58) Field of Classification Search
CPC ............ G06F 17/5095; B60K 2350/90; B60K 2350/901; B60K 35/00; B60K 37/04
See application file for complete search history.

(56) References Cited

U.S. PATENT DOCUMENTS 6,090,148 A * 7/2000 Weber ................. G06F 17/5095
703/8
7,489,303 B1 * 2/2009 Pryor ..................... B60K 35/00
345/173

(Continued)

OTHER PUBLICATIONS

Yang, J., et al. "Multi-Objective Optimization-Based Method for Kinematic Posture Prediction: Development and Validation" Robotica, vol. 29, pp. 245-253 (2010). (Year: 2010).*

(Continued)

*Primary Examiner* — Jay Hann
(74) *Attorney, Agent, or Firm* — Squire Patton Boggs (US) LLP

(57) ABSTRACT

A method for improving ergonomics of a vehicle obtains a first information defining an initial cockpit configuration. Further, information on a cockpit user's shape and information of a seat and steering wheel position which the user typically uses while driving, are obtained. This information is fed into a bio-mechanical simulation which carries out the simulation based upon the information defining the initial cockpit configuration, the user's shape and the user's seat and steering wheel position. In the bio-mechanical simulation, an ergonomic quality criteria is calculated for reaching movements during driving. Based upon the simulation result which is the quality criteria, the cockpit configuration is changed. The bio-mechanical simulation and the changing of the cockpit configuration in the optimization process is then repeated until a predetermined stop condition is fulfilled. The cockpit configuration which is achieved at that point in time is output as final cockpit-configuration.

7 Claims, 6 Drawing Sheets

(51) Int. Cl.
　　　B60K 35/00　　　(2006.01)
　　　B60K 37/00　　　(2006.01)
(52) U.S. Cl.
　　　CPC .......... B60K 37/04 (2013.01); G06F 17/5009 (2013.01); *B60K 2370/73* (2019.05); *B60K 2370/736* (2019.05)

(56) References Cited

U.S. PATENT DOCUMENTS

| | | | | |
|---|---|---|---|---|
| 9,134,955 | B2 * | 9/2015 | Healey | B60K 35/00 |
| 9,875,335 | B2 * | 1/2018 | Dariush | G06F 17/5095 |
| 9,946,334 | B2 * | 4/2018 | Pala | G06F 3/011 |
| 10,216,892 | B2 * | 2/2019 | John | G06F 17/5095 |
| 2004/0263531 | A1 * | 12/2004 | Maille | G06T 13/40 345/619 |
| 2014/0100828 | A1 * | 4/2014 | Dariush | G06F 17/5095 703/2 |

OTHER PUBLICATIONS

Singh, S., et al. "Computerized Human Manikins for Development and Fabrication of Ergonomic Products—A Review and Concept for Comprehensive Software" Agricultural Engineering Today, vol. 38, No. 3 (2014). (Year: 2014).*

Ngatchou, P., et al. "Pareto Multi Objective Optimization" Proceedings of 13th Int'l Conf. on Intelligent Systems Application to Power Systems, pp. 84-91 (2005) available from <http://ieeexplore.ieee.org/document/1599245/>. (Year: 2005).*

Mukhopadhyay, S., et al. "Computer Aided Design in Digital Human Modeling for Human Computer Interaction in Ergonomic Assessment: A Review" Int'l J. Advanced Computer Research, vol. 2, No. 4 (2012) (Year: 2012).*

Yang, J., et al. "A new digital human environment and assessment of vehicle interior design" Computer-Aided Design, vol. 39, issue 7, pp. 548-558 (2007) available from <https://www.sciencedirect.com/science/article/pii/S0010448506002120> (Year: 2007).*

Reed, M., et al. "A New Approach to Modeling Driver Reach" SAE 2003-01-0587 (2003) (Year: 2003).*

"Handbook of Digital Human Modeling: Research for Applied Ergonomics and Human Factor Engineering" Eds. Duffy (2008) (Year: 2008).*

Magistris, G., et al. "Dynamic control of DHM for ergonomic assessments" Int'l J. Industrial Ergonomics, vol. 43, pp. 170-180 (2013) (Year: 2013).*

Y. Koren, "Reconfigurable Manufacturing and Beyond," (Summary of a keynote speech, CIRP 3rd International conference on Reconfigurable Manufacturing, May 2005 (CIRP05), pp. 1-7.

Heon-Jeong Kim et al., "Biodynamic Characteristics of Upper Limb Reaching Movements of the Seated Human Under Whole-Body Vibration," Journal of Applied Biomechanics, vol. 29, 2013, pp. 12-22.

Stefan Menzel et al., "Representing the Change-Free Form Deformation for Evolutionary Design Optimization," In Evolutionary Computation in Practice, 2007, Chapter 4, pp. 63-86.

* cited by examiner

METHOD FOR IMPROVING ERGONOMICS OF A VEHICLE COCKPIT

BACKGROUND

Field

The invention relates to a method for improving ergonomics of a vehicle cockpit so that prior to manufacturing a vehicle, like a car or a motorcycle, a cockpit configuration can be defined that offers improved ergonomic characteristics compared to standard cockpit configurations.

Description of the Related Art

Over the last years, expectations of customers with respect to products they buy have increased. In particular, there is a higher expectation that the chosen product fulfills all the individual needs and meets the preferences the customer has. Thus, product design more and more takes into consideration that the products have to be designed in a way that allows adaptation to the personal preferences of a customer. In many cases, this requires that the personal needs and preferences of the user are defined a long time before the product in the end may be purchased. For example, producing a car takes quite a while and thus, at an early point in time the configuration has to be defined and a later adaptation of the production process is merely impossible.

Nevertheless, personalization in general and also personalization of cars is a hot topic. It is known in the art and described for example in Y. Koren, "Reconfigurable Manufacturing and Beyond" (Summary of a keynote Speech, CIRP 3rd International conference on Reconfigurable Manufacturing, May 2005) that in interaction with a customer a preferred interior of the vehicle can be defined by choosing from a defined set of modules. Of course, these predefined modules take account of physical constraints and thus adaptation to the customer's preferences is limited. Modern manufacturing and assembly techniques offer a wide variety of adaptation of different items in the interior of a vehicle and thus, the selection of modules and definition of a configuration for a particular car or other vehicle becomes complex. When looking at a car for example the variety of the components of the finished product already starts with trivial variability like seat adjustment, but also includes more sophisticated like the individual configuration of the display in the dashboard. But since it is of course easy for the customer to adjust the position of the seat when using the car or choosing a different design on a display which nowadays often replaces a dashboard, such personalization does not need to be known already during the manufacturing process.

However, in contrast to these adaptations, it is also possible that individual adjustment of hardware components is performed regarding the wider vehicle cockpit, meaning also the layout of operation buttons, design and shape of the entire dashboard or the like. Of course, such adaptations have to be defined well before the production of the vehicle. If such adaptation of the entire configuration of the interior of the car is possible or similarly of the cockpit area of a motorcycle, it is evident that changing the configuration has a significant impact on the ergonomics of the vehicle's cockpit. Thus, before the final configuration, which is to be used during the production process, is fixedly defined the customer and the manufacturer has to be sure that the resulting interior of the car with its cockpit area of a motorcycle fulfills the expectations of the customer with respect to the ergonomics during later use of the vehicle.

Thus, it is an object of the present invention to define a method that improves the ergonomics of a vehicle cockpit the configuration of which may be chosen and at least partly freely designed before the production process.

The problem is solved with the method according to the independent claim and further aspects and features are defined in the sub claims.

SUMMARY

According to the present invention, at first information defining an initial cockpit configuration is obtained. A cockpit configuration includes information about a combination of modules as well as a parameterization of the modules. A module is a part or portion of the vehicle interior or vehicle cockpit that may be individually chosen or at least adapted by the customer. For example, the customer may be allowed to choose differently sized buttons for operating functions of the vehicle. Parts of the dashboard may be offered with different shapes so that the customer may chose between them. Even the entire dashboard may have different curvatures and shapes also being selected by the user. Sizes of knobs and their placement, shapes of handles and their placement can also be personalized. Since accessories may be individually selected by a customer, even the existence of particular knobs and operation elements is a consequence of the modules that are chosen by the customer. Each module that is chosen is defined in its particular appearance in the final cockpit by parameters relating to size, position, relative position to other modules and so on.

In addition to the information that defines an initial cockpit configuration from which the simulation of the inventive method starts, also information on a cockpit-user's shape is obtained as well as information of a seat and/or steering means position the user typically uses when driving. The steering means will usually be the steering wheel when speaking of a car. But even motorcycles offer sometimes the opportunity to individually position the steering bar and also the driver's seat at least with respect to height. When speaking of vehicles in the context of the present invention, all kinds of road vehicles are considered anyway like vans, lorries, busses, cars and motorcycles, but also any other kind of vehicle can be optimized by using the invention.

After the information is obtained, a bio-mechanical simulation is conducted on the basis of the information obtained. By conducting the bio-mechanical simulation, an ergonomic quality criteria for reaching movements during driving is calculated. Such an ergonomic quality criteria is a measure for the ergonomics a particular cockpit configuration offers. Reaching movements are movements of a driver that are needed in order to operate the car or to use particular functions of the car. The quality criteria characterizes elements of the physical and cognitive ergonomics of reach movements. Physical ergonomics is concerned with human anatomy, and some of the anthropometric, physiological and bio-mechanical characteristics as they relate to physical activity (source: Wikipedia, 25 Mar. 2015).

Cognitive ergonomics: Cognitive ergonomics is concerned with mental processes, such as perception, memory, reasoning, and motor response, as they affect interactions among humans and other elements of a system (source: Wikipedia, 25 Mar. 2015). In the context of this invention, cognitive ergonomics shall particularly refer to the distraction from the main driving task that any reaching and/or handling movement of the driver will result in. An example for quality criteria for physical ergonomics is for example movement efficiency that can be defined as the percentage of energy expended by the body that is converted to mechanical work. An example for quality criteria of cognitive ergonomics is the time that is required to execute the movement under equal energy constraints.

After ergonomic quality criteria has been calculated, the cockpit configuration undergoes an optimization process. In the optimization process, which can be a well-known optimization process, the simulation result is used and a new cockpit configuration or adapted cockpit configuration is generated. On the basis of this amended or new cockpit configuration, the bio-mechanical simulation is repeated as long as a stop condition is not yet fulfilled.

Again new values for the ergonomic quality criteria are calculated and the optimization process is also repeated in order to find an improved cockpit configuration. This loop stops as soon as a stop condition is fulfilled. Such a stop condition may be a time limit that is set or a quality criterion that exceeds a predetermined threshold. Then a definition for the cockpit configuration which is at that point in time is achieved as output as the final cockpit configuration. This final cockpit configuration is then the basis for producing the car or other vehicle.

The inventive method has the big advantage that the variability during a production process is used in order to optimize the layout and configuration of the cockpit but nevertheless taking into consideration the personal preferences of the user. This means that the user is able to predefine the modules that he would like to have and may be even in parts a basic layout in the initial cockpit configuration. Starting from such initial cockpit configuration then an optimization of the configuration is performed still having as a constraint the selected modules but arranging them in a way that is optimized for later use of the vehicle. Thus, situations in which a particular combination of modules results in bad ergonomics can be avoided and thus as a consequence disappointment of a customer is also avoided.

According to an advantageous embodiment the information that defines that initial cockpit configuration is already the outcome of another optimization process. This optimization process for the initial cockpit configurations starts from a predetermined basic configuration and uses feedback information received from the user as an input for the optimization process. Again optimization processes themselves are well known and the initial cockpit configuration is achieved while in the loop of optimizing the basic cockpit configuration the feedback of the user judging the intermediate output cockpit configurations is taken into account. As a consequence the initial cockpit configuration which is used for the bio-mechanical simulation already reflects the preferences and desire of the customer and thus the further optimization process on the basis of the bio-mechanical simulation is improved with respect to its efficiency.

In order to have an exact knowledge on the shape of a user what of course affects the ergonomics to a large extent the user's shape is obtained by using a 3D laser scan or image based methods. Thus, the simulation can be fed with information on the shape of a user which are rather exact. In case that the amount of data generated by the laser scan or the image based methods is too large and thus inhibits an efficient processing of the data at first the position of the joints of the human body are extracted from information on the user's shape and the simulation is then conducted using position information of the joints only. Thus, the processing cost is reduced significantly. For the calculation and simulation of the ergonomics it is sufficient to know where the joints and ankles of a user are relative to each other but the overall size, weight, width and so on of the user's body do not have a particular influence on the ergonomics.

In order to further increase the efficiency of the presently suggested method it is also advantageous to define a particular set of reaching movements in advance on the basis of which the simulation is carried out. Thus, it can be predetermined which of the reaching movements occur relatively often. Using such set of reaching movements as a basis ensures thus, that the reaching movements that are needed during driving regularly are considered but those that may occur only rarely do not affect the final cockpit configuration. When defining such set of reaching movements this means that the set is formed by a plurality of types of movements wherein a weighting factor is assigned to each of the different types of movements. Thus, it is possible not only to ignore some rarely used movements at all but to distinguish between the importance of the reach movements in the bio-mechanical simulation.

According to another advantageous embodiment physical and/or cognitive ergonomics are calculated individually as a result of the simulation. Thus, different aspects of the simulation can be analyzed and again be weighted individually. In particular when the quality criteria for physical and/cognitive ergonomics are weighted differently it is possible to use then a linear combination of the quality criteria in the optimization process following the simulation.

According to another embodiment it is possible to use a multi-objective optimization in the optimization process. The result of such multi-objective optimization is a Pareto front from which then the user may choose one of the Pareto front cockpit configurations.

Furthermore it is advantageous to include information received from the customer into the inventive method which means that during conducting the simulation and the optimization cockpit configurations that are subject of the simulation are visualized to the user. Then the user can give feedback and the feedback information that is obtained from the user and which includes information on preferences of the user can then be used together with the combined quality criteria in the optimization process.

BRIEF DESCRIPTION OF THE DRAWINGS

Advantageous aspects will be described further with respect to the drawings in which.

DETAILED DESCRIPTION

Figure 1:
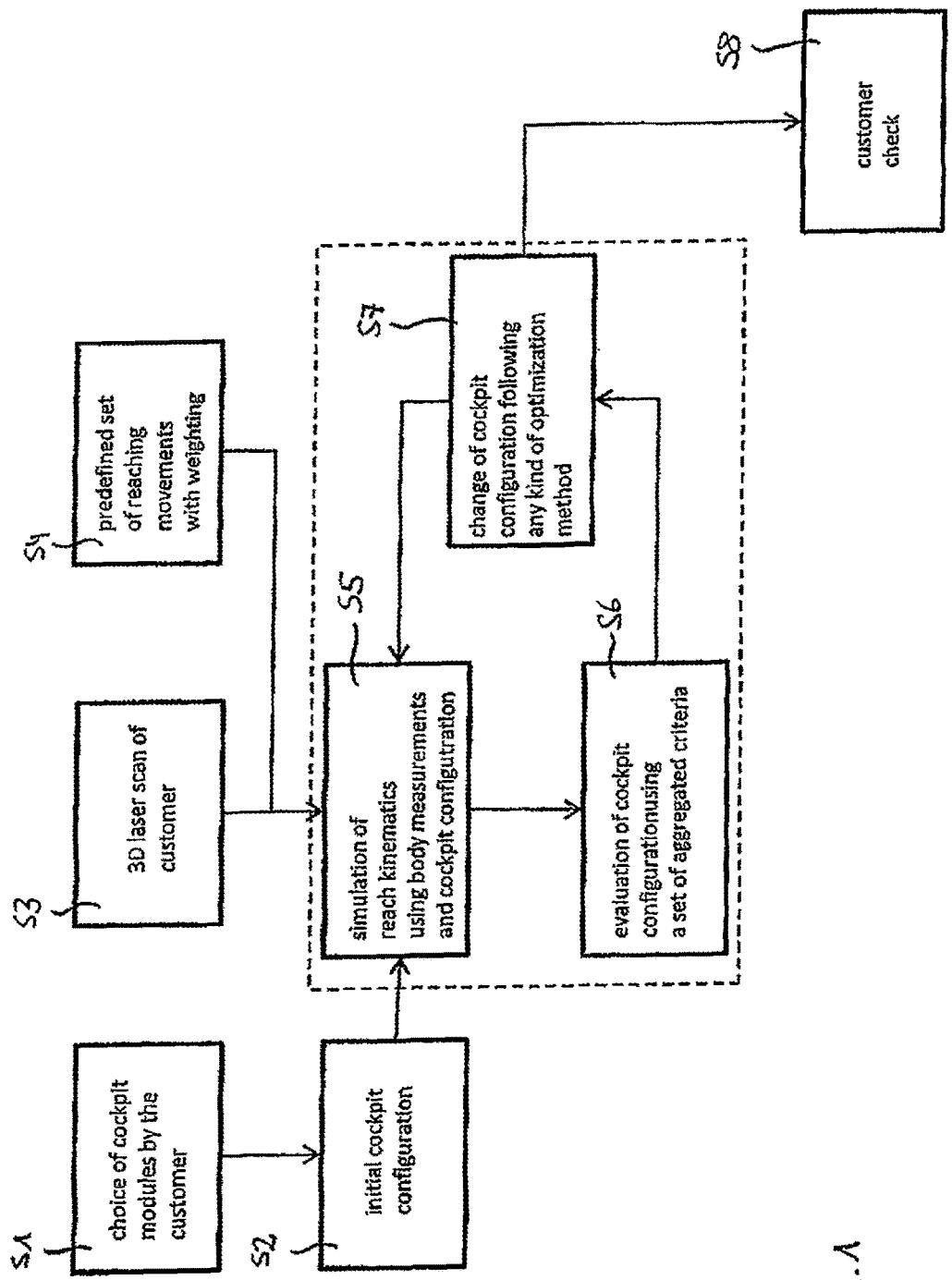
FIG. 1 shows a first embodiment of the present invention using a predefined set of reaching movements with weighting.

In FIG. 1 a first embodiment for illustrating the inventive method is shown. A diagram shows the different method steps that are performed. At first, in step S1 the customer selects the modules he wants to be included in the final cockpit. In step S2, there is defined an initial cockpit configuration on the basis of the selected modules. The initial cockpit configuration includes not only information on the chosen modules themselves, but also a first set of parameters that define relative position, absolute position, individual shape of the entire module or an operation button of the chosen module or the like.

Furthermore, in step S3 the shape of the customer is measured. In the present embodiment, a 3D-laser scan of the customer is performed and the resulting information is fed together with information on a position of a seat and steering wheel to the simulation process to which also the initial cockpit configuration is supplied. The position of the seat and steering wheel is known from adjustment the customer (user) makes when he takes a seat in a model car. In order to avoid any misunderstanding instead of "information" of the cockpit configuration, the cockpit configuration itself is referred to, but it is evident that a simulation algorithm can make use only on the information on the shape and the information on the cockpit configuration and that also for example the shape of a customer itself cannot be input but respective information.

In addition, to the initial cockpit configuration and the shape of the customer, the simulation algorithm needs to know which reaching movements shall be the basis for the simulation. Thus, a predefined set of reaching movement, each reaching movements being associated with a weighting is read in from a memory. Such memory can include a plurality of sets of reaching movements that are for example to be chosen on the basis of the combination of modules that is selected by the customer.

After the predefined set of reaching movements has been read in in step S4, a simulation of reach kinematics using body measurements and cockpit configuration is conducted as depicted in the drawing as step S5. The result of such simulation which can be performed for example as described in Heon-Jeong Kim and Bernard J. Martin "Biodynamic Characteristics of Upper Limb Reaching Movements of the Seated Human Under Whole-Body Vibration" (Journal of Applied Biomechanics, 29, 12-22, 2013) the number of quality criteria is output from the simulation algorithm. These quality criteria comprise different elements, like physical ergonomics and cognitive ergonomics.

In the next step S6, an evaluation of cockpit configurations is performed using a set of aggregated criteria. "Aggregated criteria" means that different quality criteria are weighted and linearly combined into one quality criteria. Such single quality criteria can then be used in a single optimization method which is performed in step S7. In the optimization process of step S7, the cockpit configuration is changed if necessary. The optimization process or algorithm which is used in order to adapt parameters of the cockpit configuration may be any optimization method that does not require gradient information. One example of an optimization method that can be used is an evolutionary algorithm as it is described in Stefan Menzel and Bernhard Sendhoff "Representing the change—free form deformation for evolutionary design optimization, 63-86" (In Evolutionary Computation in Practice, 2007). By the present invention, the bio-mechanical simulation and the evaluation of the reaching movement is thus embedded into an optimization process.

The loop of steps S5, S6 and S7 is repeated until a stop criterion is reached. Such stop criteria can be for example reaching a threshold for the single quality criterion or if such quality criteria cannot be reached, a time out for repeating the entire loop. At this point in time, one cockpit configuration is defined and this cockpit configuration is output as the final cockpit configuration. The final cockpit configuration having defined all the modules that were selected by the customer, but also their parameters is then used in order to control the production process. Before the production process is started, it is of course possible to present the result of the optimization process for ergonomics to the customer who then can finally decide if that is what he wants to have or not.

Figure 2:
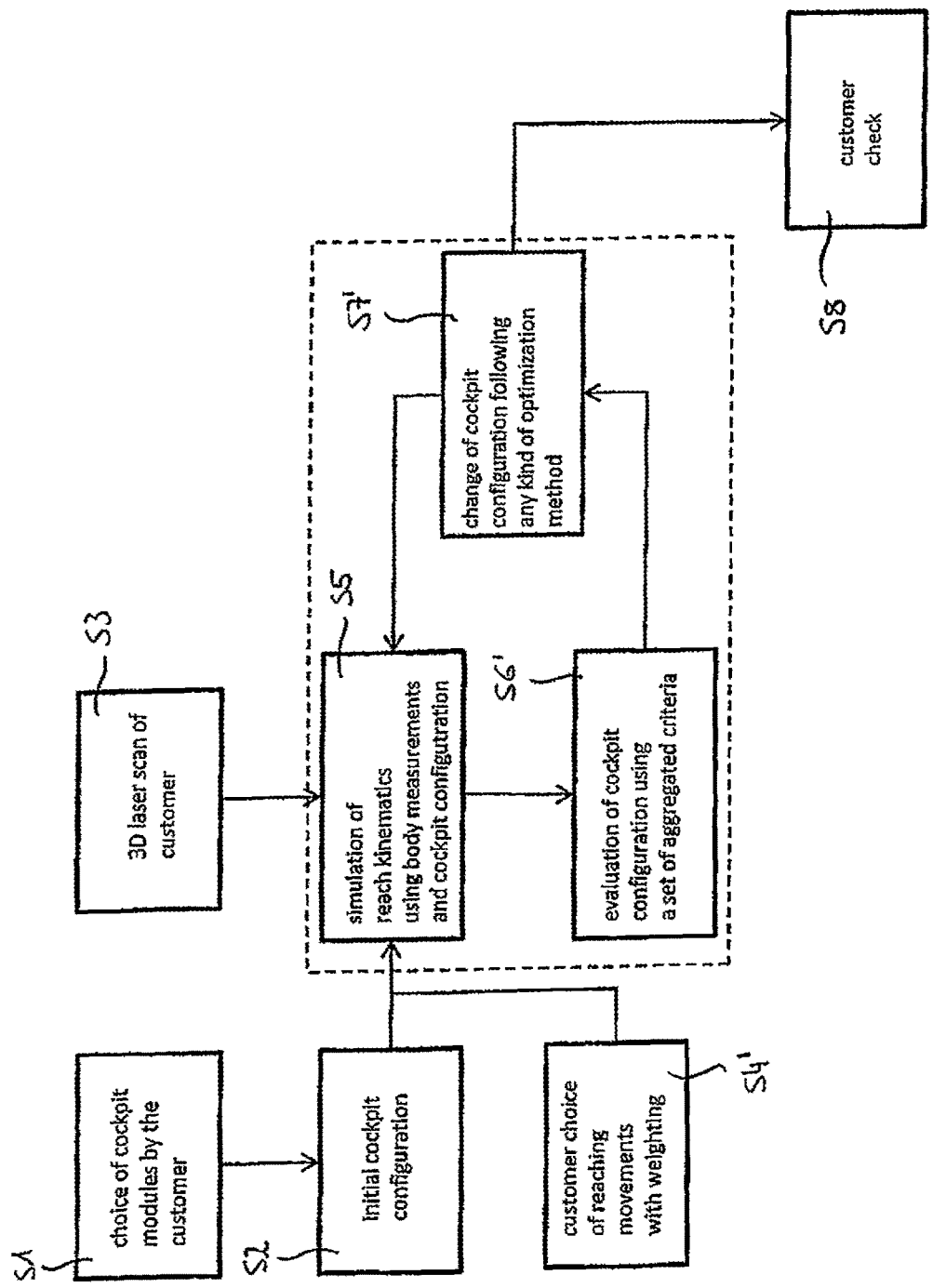
FIG. 2 shows an alternative in which the costumer defines the reaching movements for the simulation.

In FIG. 2 there is shown a slight variation of the process as described in detail with respect to FIG. 1. Contrary to using a predefined set of reaching movements with weighting, the reaching movements are defined on the basis of information received from the customer. This can be used in particular in case that in the process as shown in FIG. 1, the customer finally decides that the outcome of the optimization does not reflect his particular needs, since he prefers to emphasize a different movement to be executed comfortably. Thus, if the customer which usually is the driver of a car in the future is aware that he would like to optimize particular aspects and particular reaching movements in the cockpit during driving the car, it is possible to receive information from the customer on such reaching movements and use them as a basis for the simulation.

Since the rest of the steps of the method is the same as described with reference to FIG. 1, no particular repetition thereof is given.

Figure 3:
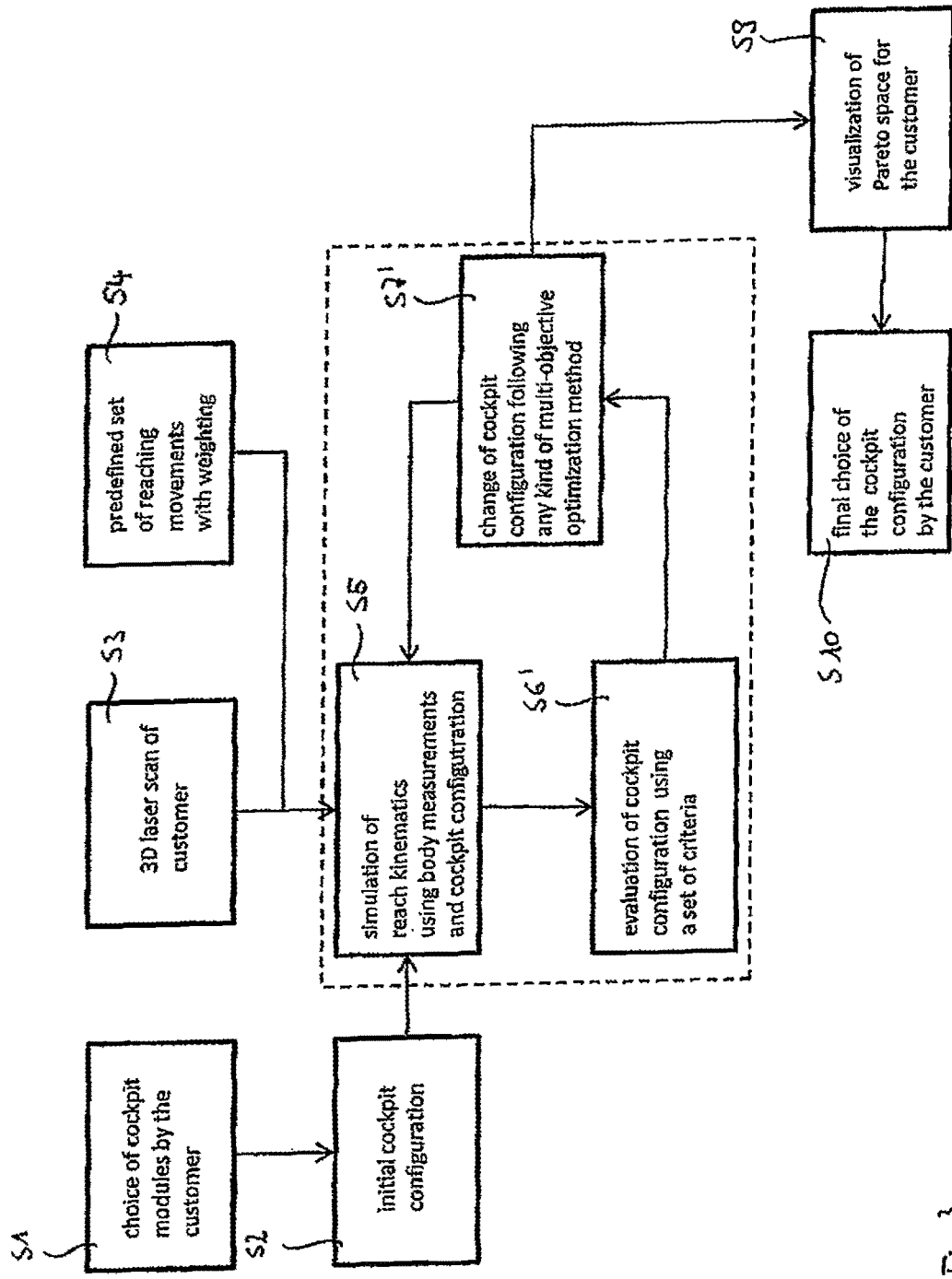
FIG. 3 shows the inventive method using a multi-objective optimization method.

FIG. 3 on the other side shows that contrary to step S6 the evaluation of the cockpit configuration is not performed on the basis of a single quality criterion resulting from an aggregation of criteria but on the basis of a set of criteria in step S6'. The set of criteria is then used in a multi-objective optimization method in step S7'. The result of such optimization for the plurality of criteria is a Pareto front which can then be visualized to the customer. Thus, the different opportunities that are defined in the Pareto front form a basis for a decision of the user. The Pareto front shows comparable results and thus the user can decide which one he would like best. The visualization is performed after the stop criterion is reached. The stop criterion again can be a time limit or individual thresholds for the individual quality criteria. In particular the stop criterion is reached only in case that any individual quality criterion reaches its respective threshold.

After the visualization of the Pareto space is based to the customer in step S9 the customer chooses his most liked cockpit configuration (S10).

Figure 4:
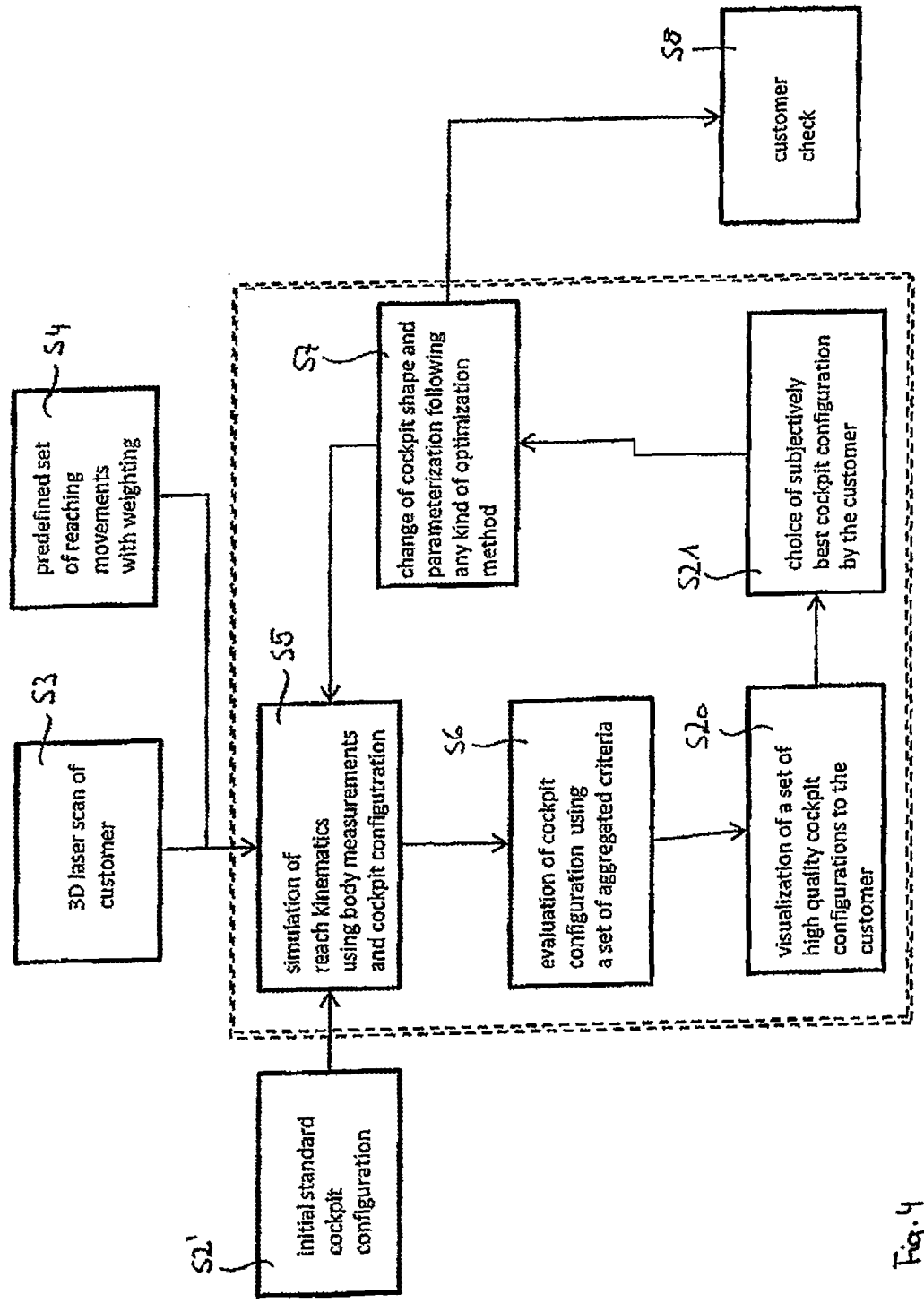
FIG. 4 shows the use of feedback information from the customer when conducting the inventive method.

FIG. 4 shows yet another alternative in which a feedback from the customer is included in the simulation/optimization process. Same method steps as in the previously explained processes again are denoted with the same step numbers and thus unnecessary repetition thereof is avoided. One difference is that the basis for the simulation uses a standard configuration as initial configuration of the cockpit (S2'), because the user's preferences and wishes are considered in the optimization process. Here again, like the process according to FIGS. 1 and 2 the evaluation of the cockpit configuration is based on a set of aggregated criteria which are weighted and combined (S6). Contrary to the previously described processes here the visualization of a set of high quality cockpit configurations is presented to the customer in step S20 so that the customer can input feedback meaning that he inputs his personal choice which is according to his understanding the subjectively best cockpit configuration. This information is then used again in the optimization process of step S7 which optimizes the chosen cockpit configuration (S21). The simulation itself in step S6 as well as the optimization in step S7 correspond to the ones explained with respect to FIG. 1. The only difference is that there is an interaction with the customer in between.

Figure 5:
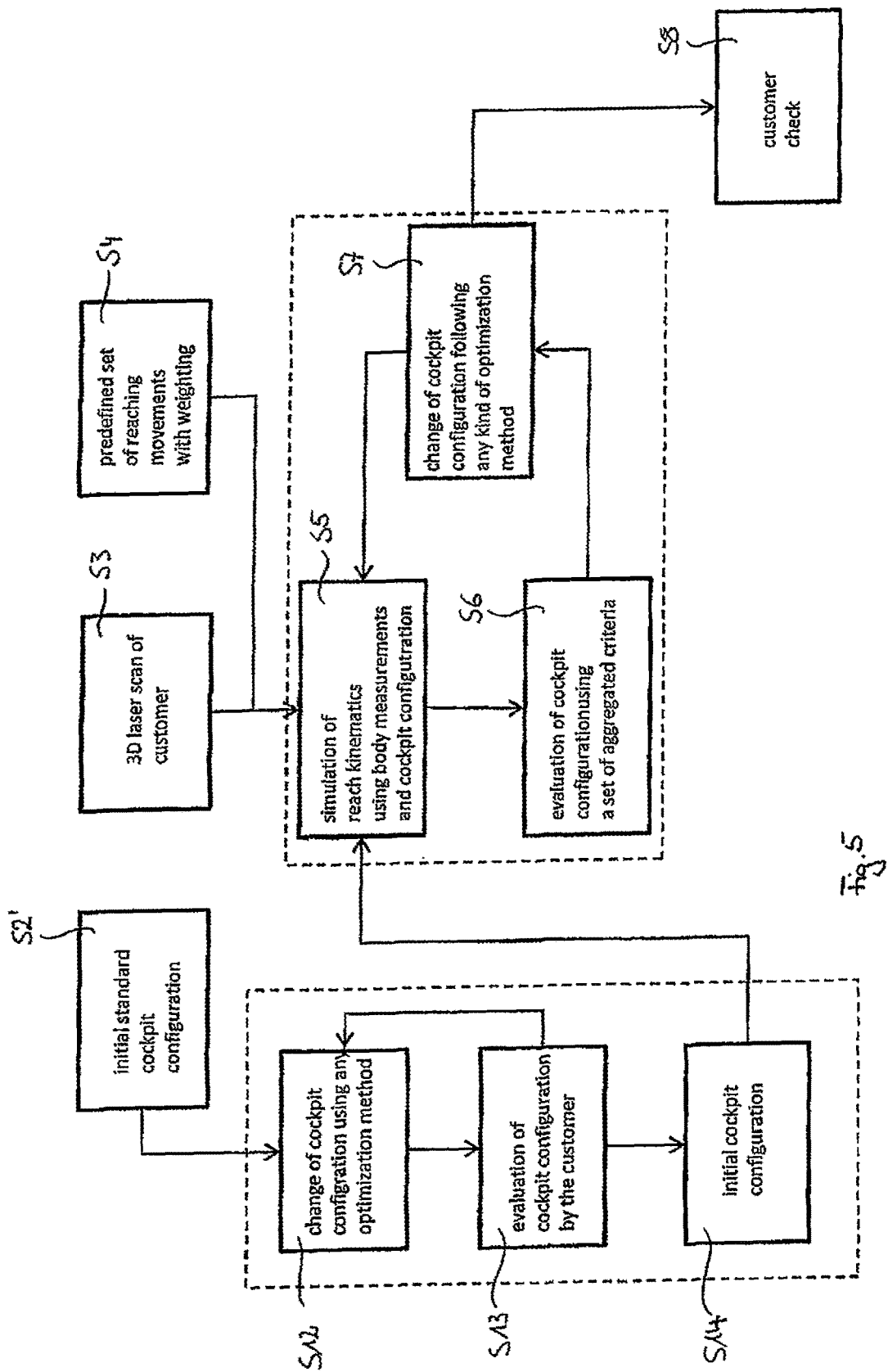
FIG. 5 shows the inventive method being conducted on the basis of an initial cockpit configuration that is defined in an interactive process.

Yet another embodiment is shown in FIG. 5. Here the initial cockpit configuration which is used as a basis for the simulation and optimization process is based on an interactive process which starts from an initial standard cockpit configuration in step S2'. This initial standard cockpit configuration is subject to an optimization process consisting of the steps of changing the cockpit configuration using an optimization method in step S12 and an evaluation of the cockpit configuration by the customer in step S13. The information on the evaluation of the customer is fed back to the optimization algorithm in step S12. This loop again is performed for either a number of times, a pre-determined time interval or until a stop criterion is reached before the then reached cockpit configuration is output as initial cockpit configuration which is the basis for the bio-mechanical simulation in step S5.

The rest of the process again corresponds to the one shown in figure S1.

Figure 6:
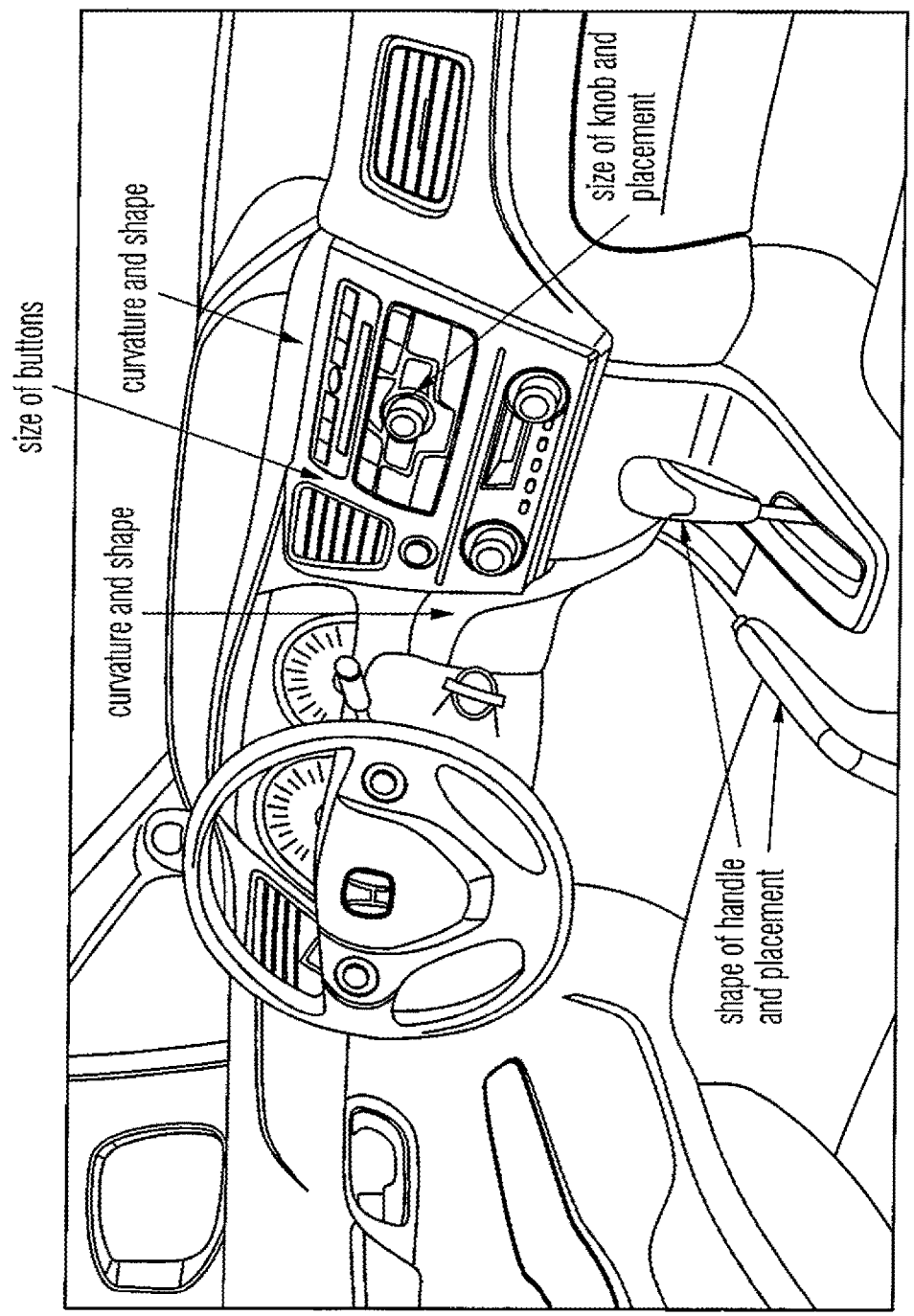
FIG. 6 shows an example for illustrating some of the parameters of cockpit configurations that are possible.

Finally, in FIG. 6 there is shown an example for a car-cockpit as vehicle cockpit indicating some modules or items in the cockpit that may be subject to adaptation and parameterization. For example parts of the dashboard or interior covers may be placed differently or in particularly may be shaped differently with respect to size and curvature. Also the size of operational buttons can be adapted or their relative position to each other. Sizes and position of knops of accessories like for example a navigation system can also be adjusted to the customer's needs as well as handles like for example a manual brake or shift lever. Of course for examples that are given are not exhaustive and the present invention may be extended to any type of item of a cockpit or a cockpit portion that might be adjusted to preferences or needs of an individual user.

What is claimed is:

1. Method for improving ergonomics of a car cockpit, said method comprising:
    obtaining information defining an initial cockpit configuration;
    obtaining information on a driver's shape by using a 3D laser scan or image based models and information of a seat and steering wheel position the driver typically uses when driving;
    defining a set of reaching movements for carrying out a bio-mechanical simulation,
    wherein the defined set of reaching movements is formed by a plurality of types of reaching movements with a weighting factor assigned to each of the types of reaching movements for distinguishing an importance of each of the types of reaching movements;
    conducting the bio-mechanical simulation on the basis of the information defining the initial cockpit configuration, information on the driver's shape and information on the seat and steering wheel position for calculating ergonomic quality criteria for the defined reaching movements during driving;
    changing the cockpit configuration in an optimization process using the simulation result;
    repeating conducting the bio-mechanical simulation and changing of the cockpit configuration until a predetermined stop condition is fulfilled;
    outputting a definition for the final cockpit-configuration; and
    manufacturing the car cockpit based on the output definition for the final cockpit-configuration,
    wherein the quality criteria includes criteria for cognitive ergonomics, and
    wherein the criteria for cognitive ergonomics refer to a distraction of the driver from a main driving task resulting from the reaching movements of the driver.

2. Method according to claim 1, wherein
the information defining the initial cockpit configuration used in the bio-mechanical simulation is obtained from a result of an optimization process starting from a predetermined basic configuration and using feedback information from the driver as an input for the optimization process.

3. Method according to claim 1, wherein positions of the joints are extracted from the information on the driver's shape and the bio-mechanical simulation is conducted using the position information.

4. Method according to claim 1, wherein in the bio-mechanical simulation ergonomic quality criteria for physical ergonomics are calculated.

5. Method according to claim 1, wherein
in the optimization process different quality criteria are weighted and linearly combined.

6. Method according to claim 1, wherein
the optimization process is a multi-objective optimization the result of which is a Pareto front.

7. Method according to claim 5, wherein
the cockpit configuration being subject to the bio-mechanical simulation is visualized to a user and feedback information regarding preference of the user is used together with the combined ergonomic quality criteria in the optimization process.

* * * * *